(12) United States Patent
Kim et al.

(10) Patent No.: US 12,167,669 B2
(45) Date of Patent: Dec. 10, 2024

(54) DISPLAY DEVICE AND METHOD OF MANUFACTURING THE SAME

(71) Applicant: Samsung Display Co., Ltd., Yongin-Si (KR)

(72) Inventors: Jae Sik Kim, Hwaseong-si (KR); Jae Ik Kim, Seoul (KR); Jung Sun Park, Yongin-si (KR); Seung Yong Song, Suwon-si (KR); Duck Jung Lee, Hwaseong-si (KR); Yeon Hwa Lee, Hwaseong-si (KR); Joon Gu Lee, Seoul (KR); Kyu Hwan Hwang, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/518,622

(22) Filed: Nov. 24, 2023

(65) Prior Publication Data
US 2024/0099114 A1    Mar. 21, 2024

Related U.S. Application Data

(62) Division of application No. 17/198,119, filed on Mar. 10, 2021, now Pat. No. 11,871,643.

(30) Foreign Application Priority Data

May 26, 2020   (KR) ........................ 10-2020-0063045

(51) Int. Cl.
*H10K 71/00*         (2023.01)
*H10K 50/822*        (2023.01)
(Continued)

(52) U.S. Cl.
CPC ........... *H10K 71/00* (2023.02); *H10K 50/822* (2023.02); *H10K 50/844* (2023.02);
(Continued)

(58) Field of Classification Search
CPC .. H10K 50/822; H10K 50/844; H10K 59/122; H10K 59/35; H10K 59/124; H10K 71/00
See application file for complete search history.

(56) References Cited

U.S. PATENT DOCUMENTS

| | | | |
|---|---|---|---|
| 9,035,545 B2 | 5/2015 | Jeong et al. | |
| 9,640,598 B2 | 5/2017 | Park et al. | |

(Continued)

FOREIGN PATENT DOCUMENTS

| | | |
|---|---|---|
| JP | 2010-054785 A | 3/2010 |
| KR | 10-2016-0099146 A | 8/2016 |

(Continued)

*Primary Examiner* — Shaun M Campbell
(74) *Attorney, Agent, or Firm* — Innovation Counsel LLP

(57) ABSTRACT

A display device may include a first electrode, a second electrode, an emission layer, an intervening layer, and a first encapsulation layer. The second electrode may overlap the first electrode. The emission layer may be disposed between the first electrode and the second electrode, may overlap the first electrode, and may include a light emitting material. The intervening layer may directly contact the second electrode, may be spaced from each of the first electrode and the emission layer, and may include a fluorine compound. A first section of the first encapsulation layer may overlap the emission layer. The intervening layer may be positioned between the second electrode and a second section of the first encapsulation layer.

5 Claims, 14 Drawing Sheets

(51) Int. Cl.
   *H10K 50/844* (2023.01)
   *H10K 59/122* (2023.01)
   *H10K 59/124* (2023.01)
   *H10K 59/35* (2023.01)

(52) U.S. Cl.
   CPC ......... *H10K 59/122* (2023.02); *H10K 59/124* (2023.02); *H10K 59/35* (2023.02)

(56) References Cited

U.S. PATENT DOCUMENTS

| | | |
|---|---|---|
| 9,768,416 B2 | 9/2017 | Choi et al. |
| 10,332,947 B2 | 6/2019 | Kim et al. |
| 2017/0025637 A1 | 1/2017 | Kim et al. |
| 2017/0330923 A1* | 11/2017 | Chung ................ H01L 27/1248 |
| 2018/0287093 A1 | 10/2018 | Lee et al. |
| 2019/0115542 A1 | 4/2019 | Yokoyama et al. |
| 2020/0409412 A1 | 10/2020 | Kim et al. |
| 2022/0209161 A1 | 1/2022 | Kim et al. |
| 2022/0123081 A1* | 4/2022 | Park ..................... H10K 59/353 |

FOREIGN PATENT DOCUMENTS

| | | |
|---|---|---|
| KR | 10-2017-0129318 A | 11/2017 |
| KR | 10-2017-0140490 A | 12/2017 |
| KR | 10-2018-0026599 A | 3/2018 |
| KR | 10-2018-0059645 A | 6/2018 |
| KR | 10-2019-0060473 A | 6/2019 |

* cited by examiner

DISPLAY DEVICE AND METHOD OF MANUFACTURING THE SAME

CROSS-REFERENCE TO RELATED APPLICATION(S)

This application is a divisional application of U.S. patent application Ser. No. 17/198,119 filed on Mar. 10, 2021, which claims priority under 35 USC § 119 to Korean Patent Application No. 10-2020-0063045 filed on May 26, 2020 in the Korean Intellectual Property Office (KIPO); the Korean Patent Application is incorporated by reference.

BACKGROUND

1. Field

The technical field relates to a display device and a method of manufacturing the display device.

2. Description of the Related Art

A display device may display an image according to an input signal.

The display device may include light emitting elements that emit light for forming the image and may include an encapsulation layer covering the light emitting elements. The encapsulation layer may protect the light emitting elements from impurities. When the encapsulation layer is damaged, impurities may flow into the light emitting elements and may damage the light emitting elements.

SUMMARY

Embodiments may be related to a display device in which an encapsulation layer is not damaged.

Embodiments may be related to a method of manufacturing a display device that may prevent damage to an encapsulation layer of the display device.

A display device according to an embodiment may include the following elements: a substrate on which a pixel area displaying an image and a transmission area transmitting an external light are defined, a first electrode disposed on the substrate in the pixel area, an intermediate layer disposed on the first electrode in the pixel area and including an emission layer and at least one common layer, a second electrode disposed on the intermediate layer in the pixel area, a surface control layer disposed between the second electrode on the intermediate layer and the transmission area and including a fluorine compound, and an encapsulation layer disposed on the second electrode and the surface control layer in the pixel area and the transmission area.

The second electrode may not overlap the surface control layer.

The second electrode may overlap only an edge of the surface control layer.

The display device may further include an agglomerated particle disposed between the surface control layer and the encapsulation layer and including a same material as the second electrode.

The surface control layer may be parallel to the substrate in a cross-sectional view.

The surface control layer may be inclined to the substrate in a cross-sectional view.

The surface control layer may surround the transmission area in a plan view.

The fluorine compound may include at least one of a difluoromethylene group, a trifluoromethyl group, and a fluorosilane.

The second electrode may include at least one of magnesium (Mg), silver (Ag), aluminum (Al), lithium (Li), calcium (Ca), indium (In), and ytterbium (Yb).

A surface energy of the surface control layer may be greater than 0 mJ/m$^2$ and less than or equal to about 30 mJ/m$^2$.

The display device may further include a capping layer disposed between the second electrode and the encapsulation layer in the pixel area.

The at least one common layer, the surface control layer, and the capping layer may respectively have a first opening, a second opening, and a third opening which overlap the transmission area, and a transmitting window may be defined by the first opening, the second opening, and the third opening.

The encapsulation layer may include a first inorganic encapsulation layer, an organic encapsulation layer disposed on the first inorganic encapsulation layer, and a second inorganic encapsulation layer disposed on the organic encapsulation layer.

The emission layer may overlap the first electrode.

The at least one common layer may include a first common layer disposed between the first electrode and the emission layer and a second common layer disposed between the emission layer and the second electrode.

A method of manufacturing a display device according to an embodiment may include the following steps: forming a first electrode on the substrate in the pixel area displaying an image, forming an intermediate layer on the first electrode in the pixel area and in a transmission area transmitting an external light, the intermediate layer including an emission layer and at least one common layer, forming a surface control layer on the intermediate layer in the transmission area, forming a second electrode on the intermediate layer in the pixel area, the second electrode adjacent to the surface control layer, removing portions of the intermediate layer and the surface control layer which overlap the transmission area to form a transmitting window, and forming an encapsulation layer on the surface control layer and the second electrode in the pixel area and the transmission area.

The portions of the intermediate layer and the surface control layer may be removed by being irradiated with a laser.

The laser may be irradiated inside the surface control layer.

The method may further include forming a capping layer on the surface control layer and the second electrode before removing the portions of intermediate layer and the surface control layer, and a portion of the capping layer which overlaps the transmission area may be removed together with the portions of intermediate layer and the surface control layer.

The surface control layer may be formed by a vapor deposition, a wet coating, or a screen printing.

An embodiment may be related to a display device. The display device may include a first electrode, a second electrode, an emission layer, an intervening layer, and a first encapsulation layer. The second electrode may overlap the first electrode. The emission layer may be disposed between the first electrode and the second electrode, may overlap the first electrode, and may include a light emitting material. The intervening layer may directly contact the second electrode, may be spaced from each of the first electrode and the emission layer, and may include a fluorine compound. A first section of the first encapsulation layer may overlap the emission layer. The intervening layer may be positioned between the second electrode and a second section of the first encapsulation layer.

The second electrode may not overlap the intervening layer in a thickness direction of the intervening layer.

The second electrode may overlap an edge of the intervening layer without overlapping a center of the intervening layer in a thickness direction of the intervening layer.

The display device may include agglomerated particles disposed between the intervening layer and the first encapsulation layer and including a same material as the second electrode.

A largest face of the intervening layer may be parallel to a largest face of the emission layer.

A largest face of the intervening layer may be oblique relative to a largest face of the emission layer.

The display device may include a substrate. The second electrode may not overlap a portion of the substrate. The intervening layer may surround the portion of the substrate in a plan view of the display device.

The fluorine compound may include at least one of a difluoromethylene group, a trifluoromethyl group, and a fluorosilane.

The second electrode may include at least one of magnesium (Mg), silver (Ag), aluminum (Al), lithium (Li), calcium (Ca), indium (In), and ytterbium (Yb).

A surface energy of the intervening layer may be greater than 0 mJ/m$^2$ and less than or equal to 30 mJ/m$^2$.

The display device may include a capping layer disposed between the second electrode and the first encapsulation layer and overlapping the emission layer.

The display device may include a common layer and a substrate. The common layer may directly contact the emission layer. The common layer, the intervening layer, and the capping layer may respectively have a first opening, a second opening, and a third opening exposing a same portion of the substrate.

The display device may include a second encapsulation layer and an organic encapsulation layer disposed between the first encapsulation layer and the second encapsulation layer. At least one of the first encapsulation layer and the second encapsulation layer may be formed of an inorganic material.

The intervening layer may directly contact the second section of the first encapsulation layer.

The display device may include the following elements: a first common layer disposed between the first electrode and the emission layer; and a second common layer disposed between the emission layer and the second electrode.

An embodiment may be related to a method for manufacturing a display device. The method may include the following steps: forming a first electrode; forming an emission layer that overlaps the first electrode and includes a light emitting material; forming an intervening material layer that is spaced from each of the first electrode and the emission layer and includes a fluorine compound; forming a second electrode that directly contacts the intervening material layer; partially removing the intervening material layer to form an intervening layer that includes an exposed side; and forming a first encapsulation layer that overlaps the emission layer and directly contacts the exposed side of the intervening layer.

The intervening material layer may be partially removed by a laser to expose the exposed side of the intervening layer.

The laser may be irradiated within a perimeter of the intervening material layer.

The method may include forming a capping material layer on the intervening material layer and the second electrode before partially removing the intervening material layer. The capping material layer may be partially removed to form a capping layer when or immediately before the intervening material layer is partially removed.

The intervening material layer may be formed by vapor deposition, wet coating, or screen printing.

A display device according to embodiments may include a surface control layer (or intervening layer) disposed between a second electrode and a transmission area and including a fluorine compound, so that the encapsulation layer may not be damaged by a burr on an end portion of the second electrode.

In a method for manufacturing a display device according to embodiments, portions of an intermediate layer and a surface control layer (an intervening layer) which overlap a transmission area of a substrate may be removed to form a transmission window, so that no significant burr may be generated on an end of a second electrode or scattered particles from the second electrode may be minimized. Advantageously, an encapsulation layer of the display device may not be damaged.

DETAILED DESCRIPTION OF EMBODIMENTS

Example embodiments are described with reference to the accompanying drawings. Although the terms "first," "second," etc. may be used to describe various elements, these elements should not be limited by these terms. These terms may be used to distinguish one element from another element. A first element may be termed a second element without departing from teachings of one or more embodiments. The description of an element as a "first" element may not require or imply the presence of a second element or other elements. The terms "first," "second," etc. may be used to differentiate different categories or sets of elements. For conciseness, the terms "first," "second," etc. may represent "first-type (or first-set)," "second-type (or second-set)," etc., respectively.

The term "connect" may mean "electrically connect" or "electrically connected through no intervening transistor." The term "insulate" may mean "electrically insulate" or "electrically isolate." The term "conductive" may mean "electrically conductive." The term "layer" may mean "member." The term "contact" may mean "directly contact." The term "surface control layer" may mean "intervening layer."

Figure 1:
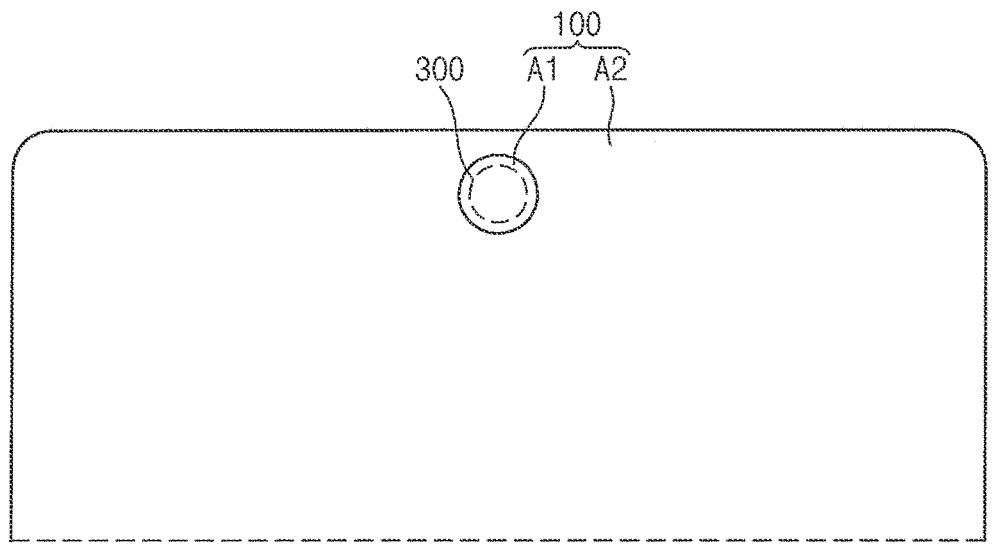
FIG. 1 is a plan view illustrating a portion of a display device according to an embodiment.

FIG. 1 is a plan view illustrating a portion of a display device 100 according to an embodiment.

Referring to FIG. 1, the display device 100 may include a first area A1 and a second area A2. Each of the first area A1 and the second area A2 may be a display area for displaying an image. The first area A1 may include a transmission area transmitting external light. Because the first area A1 includes the transmission area, a transmittance of the first area A1 may be greater than a transmittance of the second area A2. The first area A1 may transmit external light incident into the first area A1 while displaying (a portion of) an image.

The first area A1 and the second area A2 may be adjacent to each other. The second area A2 may surround at least a portion of the first area A1. For example, the first area A1 may be disposed inside the display area 100 and spaced apart from an edge of the display device 100 in a plan view of the display device 100, and the second area A2 may substantially surround the first area A1.

The first area A1 may have a circular shape in a plan view. The first area A1 may have one or more of various polygonal shapes in the plan view of the display device 100.

A functional module 300 may be disposed on a rear surface of the display device 100. The functional module 300 may be disposed in the first area A1 in a plan view. The functional module 300 may receive external light transmitted through the first area A1.

The functional module 300 may include at least one of a camera module for capturing (or recognizing) an image of an object located on a front surface of the display device 100, a face recognition sensor module for detecting a face of a user, a pupil recognition sensor for detecting an eye of the user, an acceleration sensor module and/or a geomagnetic sensor module for determining the movement of the display device 100, a proximity sensor module and/or an infrared sensor module for detecting whether the front surface of the display device is close, and an illumination sensor module for measuring the degree of external brightness.

Figure 2:
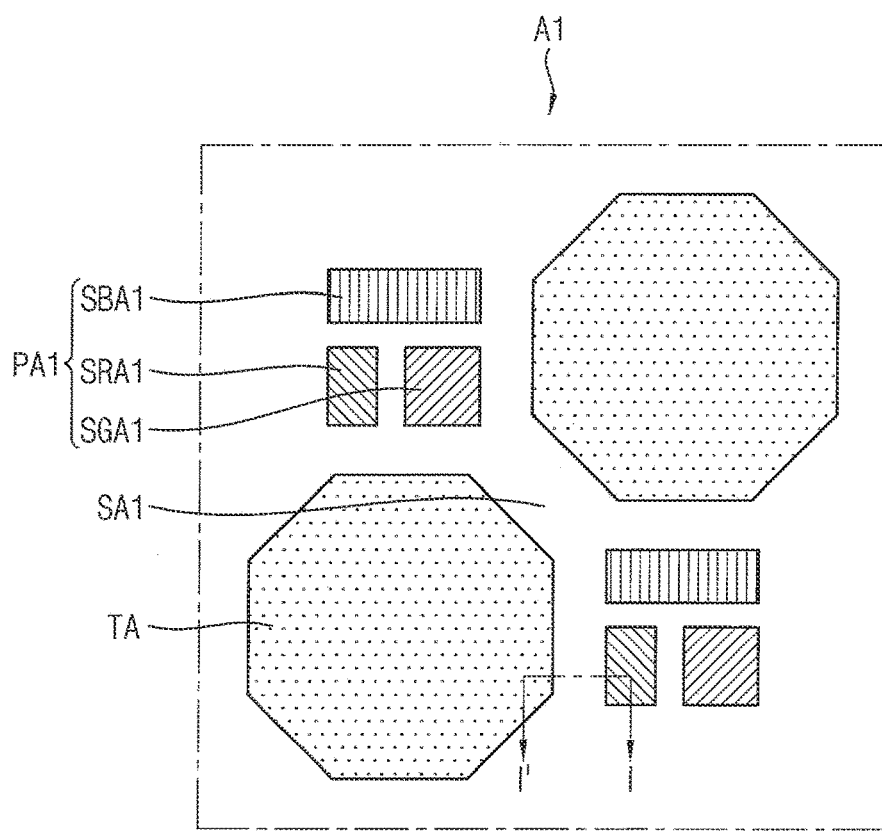
FIG. 2 is a plan view illustrating a first area in FIG. 1 according to an embodiment.
Figure 3:
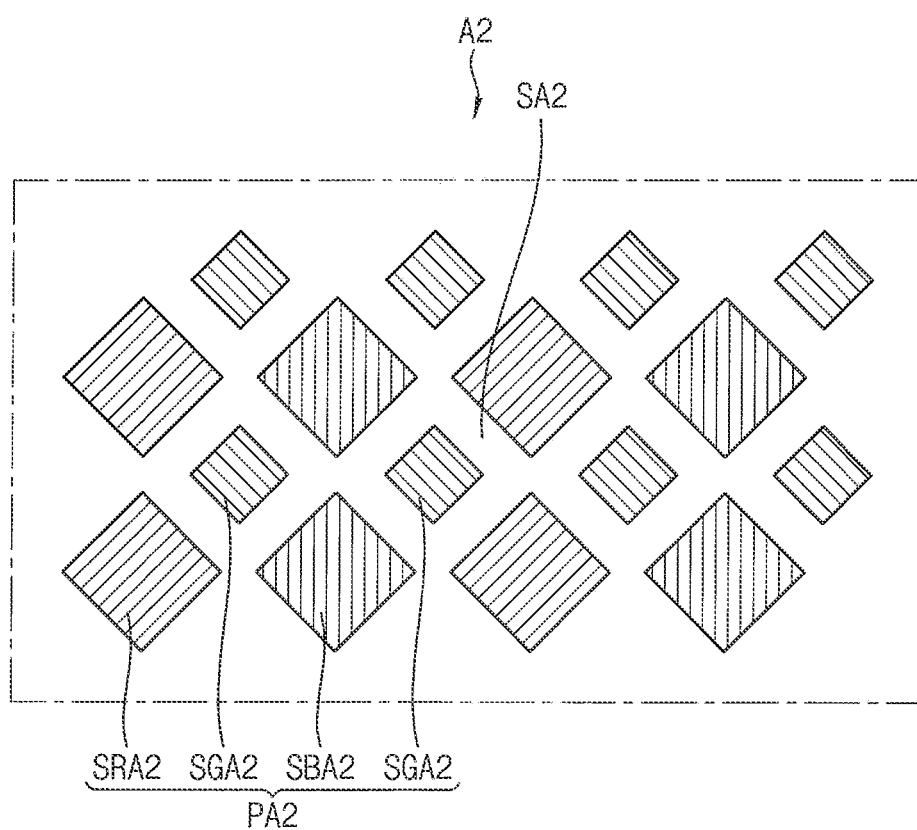
FIG. 3 is a plan view illustrating a second area in FIG. 1 according to an embodiment.

FIG. 2 is a plan view illustrating the first area A1 in FIG. 1 according to an embodiment. FIG. 3 is a plan view illustrating the second area A2 in FIG. 1 according to an embodiment.

Referring to FIGS. 1 to 3, the first area A1 may include a first pixel area PA1, a transmission area TA, and a first surrounding area SA1; the second area A2 may include a second pixel area PA2 and a second surrounding area SA2. Each of the first pixel area PA1 and the second pixel area PA2 may include pixels for emitting light.

The first pixel area PA1 may include first sub-pixel areas SRA1, SGA1, and SBA1 which emit light having different colors. The second pixel area PA2 may include second sub-pixel areas SRA2, SGA2, and SBA2 which emit light having different colors. The first sub-pixel areas SRA1, SGA1, and SBA1 may include a first red pixel area SRA1 emitting red light, a first green pixel area SGA1 emitting green light, and a first blue pixel area SBA1 emitting blue light. The second sub-pixel areas SRA2, SGA2, and SBA2 may include a second red pixel area SRA2 emitting red light, at least a second green pixel area SGA2 emitting green light, and a second blue pixel area SBA2 emitting blue light.

The transmission area TA may transmit external light incident into the display device 100. Because the first area A1 includes the transmission area TA transmitting the external light, the functional module 300 disposed on the rear surface of the display device 100 corresponding to the first area A1 may detect or recognize an object or a user located on the front surface of the display device 100 through the transmission area TA. The first surrounding area SA1 may surround the first pixel area PA1 and the transmission area TA. The second surrounding area SA2 may surround the second pixel area PA2. Each of the first surrounding area SA1 and the second surrounding area SA2 may not emit light and may not substantially transmit external light.

Because the first area A1 includes the transmission area TA, a number of the first sub-pixel areas SRA1, SGA1, and SBA1 per unit area may be less than a number of the second sub-pixel areas SRA2, SGA2, and SBA2 per unit area. A resolution of the first area A1 may be less than a resolution of the second area A2.

An arrangement or structure of the first sub-pixel areas SRA1, SGA1, and SBA1 may be different from an arrangement or structure of the second sub-pixel areas SRA2, SGA2, and SBA2. For example, the first sub-pixel areas SRA1, SGA1, and SBA1 may be arranged as a stripe manner with edges being parallel to edges of the display device 100 in a plan view of the display device 100, and the second sub-pixel areas SRA2, SGA2, and SBA2 may be arranged as a PENTILE™ with edges being oblique relative to edges of the display device 100 in a plan view of the display device 100. The first pixel area PA1 may include one first red pixel area SRA1, one first green pixel area SRG1, and one first blue pixel area SBA1. The second pixel area PA2 may include one second red pixel area SRA2, two second green pixel areas SRG2, and one second blue pixel area SBA2.

The transmission area TA may have at least one of various shapes in a plan view. The transmission area TA may have an octagonal shape in the plan view as illustrated in FIG. 2. The transmission area TA may have a hexadecagonal shape, a circular shape, or the like in the plan view.

Figure 4:
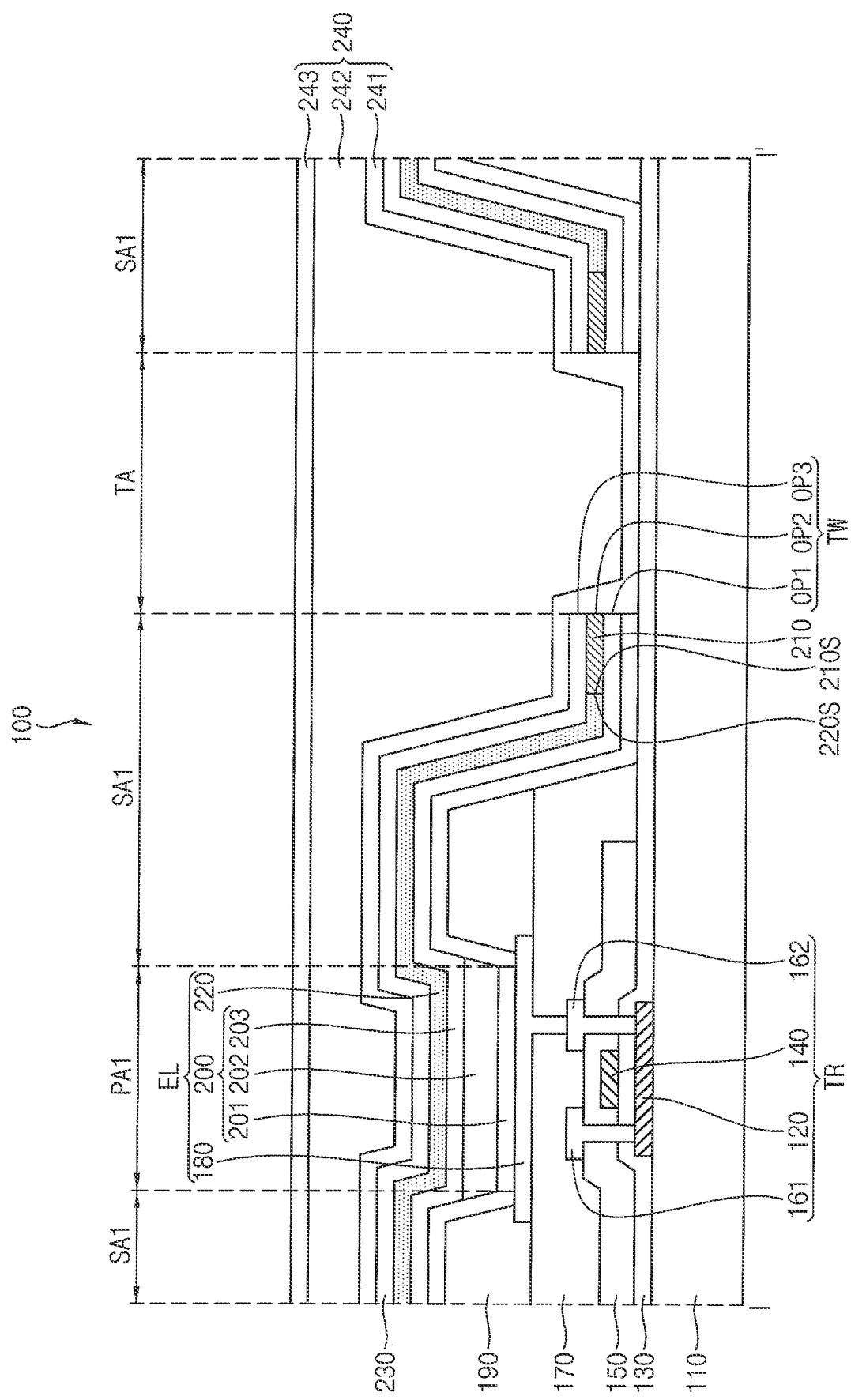
FIG. 4 is a cross-sectional view taken along a line I-I' in FIG. 2 according to an embodiment.
Figure 5:
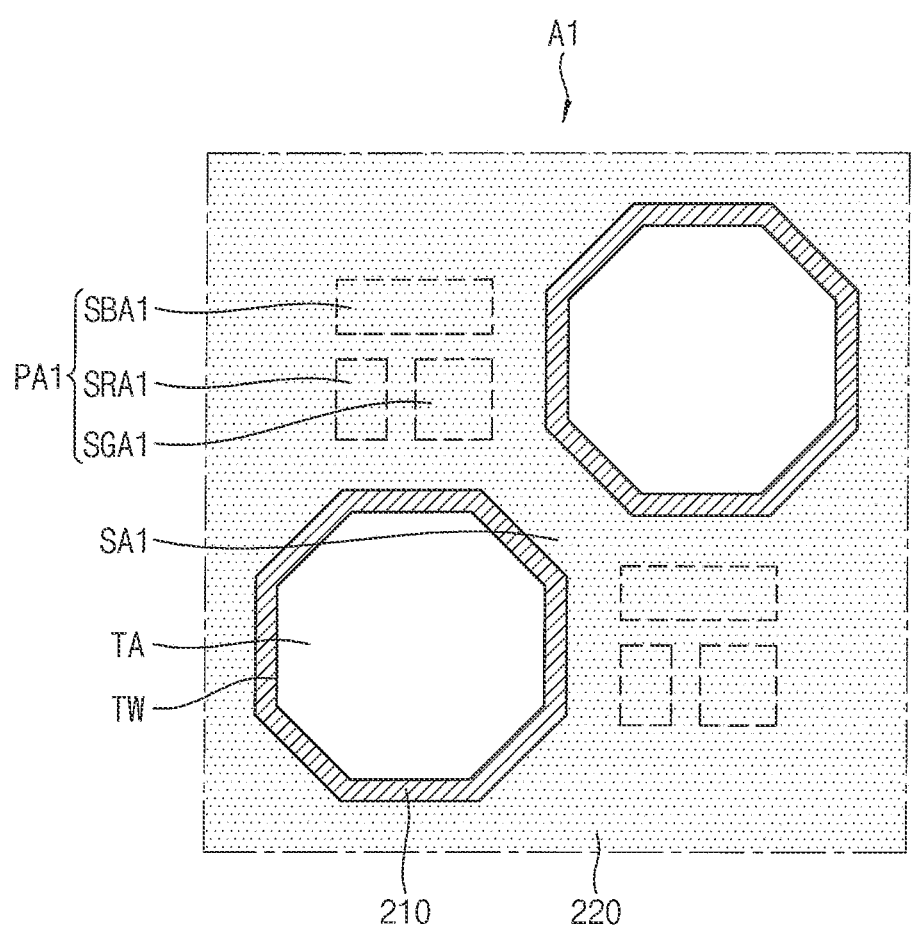
FIG. 5 is a plan view illustrating a surface control layer and a second electrode in FIG. 4 according to an embodiment.

FIG. 4 is a cross-sectional view illustrating the display device 100 taken along a line I-I' in FIG. 2 according to an embodiment. FIG. 5 is a plan view illustrating a surface control layer and a second electrode in FIG. 4 according to an embodiment.

A cross-sectional structure of the second pixel area PA2 and the second surrounding area SA2 of the second area A2 may be substantially the same as or similar to cross-sectional structure of the first pixel area PA1 and the first surrounding area SA1 of the first area A1. Accordingly, description of the first area A1 may be substantially applicable to the second area A2.

Referring to FIGS. 2, 3, 4, and 5, the display device 100 may include a substrate 110, a plurality of conductive layers 120, 140, 161, and 162, a plurality of inorganic insulation layers 130 and 150, a planarization layer 170, a first electrode 180, a pixel defining layer 190, an intermediate layer 200, a surface control layer 210, a second electrode 220, a capping layer 230, and an encapsulation layer 240.

The substrate 110 may be a transparent insulation substrate. For example, the substrate 110 may be formed of glass, quartz, plastic, or the like. The substrate 110 may include pixel areas, transmission areas, and surrounding areas corresponding to the pixel areas, transmission areas, and surrounding areas of the display device 100.

The semiconductive or conductive layers 120, 140, 161, and 162 positioned in different layers on the substrate 110. The semiconductive or conductive layers 120, 140, 161, and 162 may include an active layer 120, a gate electrode 140, a source electrode 161, a drain electrode 162. The semiconductive or conductive layers 120, 140, 161, and 162 may be disposed in the first pixel area PA1, the first surrounding area SA1, the second pixel area PA2, and/or the second surrounding area SA2.

The inorganic insulation layers 130 and 150 may perform insulation between the conductive layers 120, 140, 161, and 162 and may be disposed on the substrate 110. The inorganic insulation layers 130 and 150 may include a gate insulation layer 130 and an insulation interlayer 150.

The active layer 120 may be disposed on the substrate 110. The active layer 120 may be formed of amorphous silicon, polycrystalline silicon, an oxide semiconductor, or the like. The active layer 120 may include a source region, a drain region, and a channel region disposed between the source region and the drain region. P-type or N-type impurities may be doped in the source region and the drain region, and a different type of impurities from those of the source region and the drain region may be doped in the channel region.

The gate insulation layer 130 may be disposed on the active layer 120. The gate insulation layer 130 may cover the active layer 120 on the substrate 110. The gate insulation layer 130 may insulate the gate electrode 140 from the active layer 120. The gate insulation layer 130 may be formed of an inorganic insulation material such as silicon nitride, silicon oxide, silicon oxynitride, or the like.

The gate insulation layer 130 may be disposed in the first pixel area PA1, the transmission area TA, the first surrounding area SA1, the second pixel area PA2, and the second surrounding area SA2. The gate insulation layer 130 may be disposed in the first pixel area PA1, the first surrounding area SA1, the second pixel area PA2, and the second surrounding area SA2, and may not be disposed in the transmission area TA.

The gate electrode 140 may be disposed on the gate insulation layer 130. The gate electrode 140 may overlap the channel region of the active layer 120. The gate electrode 140 may be formed of a conductive material such as metal, an alloy, or the like. For example, the gate electrode 140 may be formed of molybdenum (Mo), copper (Cu), or the like.

The insulation interlayer 150 may be disposed on the gate electrode 140. The insulation interlayer 150 may cover the gate electrode 140 on the gate insulation layer 130. The insulation interlayer 150 may insulate the source electrode 161 and the drain electrode 162 from the gate electrode 140. The insulation interlayer 150 may be formed of an inorganic insulation material such as silicon nitride, silicon oxide, silicon oxynitride, or the like.

The insulation interlayer 150 may be disposed in the first pixel area PA1, the first surrounding area SA1, the second pixel area PA2, and the second surrounding area SA2, and may not be disposed in the transmission area TA. The insulation interlayer 150 may be disposed in the first pixel area PA1, the transmission area TA, the first surrounding area SA1, the second pixel area PA2, and the second surrounding area SA2.

The source electrode 161 and the drain electrode 162 may be disposed on the insulation interlayer 150. The source electrode 161 may be connected to the source region of the active layer 120, and the drain electrode 162 may be connected to the drain region of the active layer 120. The source electrode 161 and the drain electrode 162 may be formed of a conductive material such as metal, an alloy, or the like. For example, the source electrode 161 and the drain electrode 162 may be formed of molybdenum (Mo), copper (Cu), or the like. The active layer 120, the gate electrode 140, the source electrode 161, and the drain electrode 162 may form a transistor TR. A transistor TR may be disposed in each of the first pixel area PA1 and the second pixel area PA2.

The planarization layer 170 may be disposed on the source electrode 161 and the drain electrode 162. The planarization layer 170 may cover portions of the source electrode 161 and the drain electrode 162 that protrude beyond the insulation interlayer 150. The planarization layer 170 may protect the transistor TR, and may provide a planarized surface over the transistor TR. The planarization layer 170 may be formed of an organic insulation material such as polyimide (PI) or the like. The planarization layer 170 may be disposed in the first pixel area PA1, the first surrounding area SA1, the second pixel area PA2 and the second surrounding area SA2, and may not be disposed in the transmission area TA.

The first electrode 180 may be disposed on the planarization layer 170. The first electrode 180 may be connected to the source electrode 161 or the drain electrode 162. A first electrode 180 may be disposed in each of the first pixel area PA1 and the second pixel area PA2. The first electrode 180 may be formed of a conductive material such as metal, transparent conductive oxide, or the like.

The pixel defining layer 190 may be disposed on the first electrode 180. The pixel defining layer 190 may include a pixel opening that exposes a central portion of the first electrode 180 in order to define a first pixel area PA1 or a second pixel area PA2. The pixel defining layer 190 may space the second electrode 220 from an edge of the first electrode 180 in order to prevent a potential electrical arc between the edge of the first electrode 180 and the second electrode 220. The pixel defining layer 190 may be formed of an organic insulation material such as polyimide (PI) or the like. The pixel defining layer 190 may be disposed in the first surrounding area SA1 and the second surrounding area SA2, and may not be disposed in the first pixel area PA1, the transmission area TA, and/or the second pixel area PA2.

The intermediate layer 200 may be disposed on the first electrode 180 and the pixel defining layer 190. The intermediate layer 200 may include an emission layer 202 and at least one common layer. The intermediate layer 200 may include a first common layer 201, the emission layer 202, and a second common layer 203.

The first common layer 201 may be disposed on the first electrode 180 and the pixel defining layer 190. The first common layer 201 may have a single-layer structure or a multilayer structure. The first common layer 201 may include a hole injection layer and/or a hole transport layer. The first common layer 201 may further include other functional layers on the hole injection layer and/or the hole transport layer. The first common layer 201 may be disposed in the first pixel area PA1, the first surrounding area SA1, the second pixel area PA2, and the second surrounding area SA2, and may not be disposed in the transmission area TA.

The emission layer 202 may be disposed on the first common layer 201. The emission layer 202 may overlap the first electrode 180. An emission layer 202 may be disposed in each of the first pixel area PA1 and the second pixel area PA2, and may not be disposed in the transmission area TA, the first surrounding area SA1, and the second surrounding area SA2. The emission layer 202 may include at least one of an organic light emitting material and a quantum dot.

The organic light emitting material may include a low molecular organic compound or a high molecular organic compound. For example, the low molecular organic compound may include at least one of copper phthalocyanine, diphenylbenzidine (N, N'-diphenylbenzidine), trihydroxyquinoline aluminum (tris-(8-hydroxyquinoline)aluminum), and the like. The high molecular organic compound may include poly ethylenedioxythiophene (poly(3,4-ethylenedioxythiophene), polyaniline, polyphenylenevinylene, polyfluorene, and the like.

The quantum dot may include a core including at least one of a group II-VI compound, a group III-V compound, a group IV-VI compound, a group IV element, a group IV compound, and a combination of some of the compounds. The quantum dot can have a core-shell structure including a core and a shell surrounding the core. The shell may prevent chemical denaturation of the core, and may function as a protective layer for maintaining semiconductor characteristics and as a charging layer for imparting electrophoretic characteristics to the quantum dot.

The second common layer 203 may be disposed on the first common layer 201 and the emission layer 202. The second common layer 203 may have a single-layer structure or a multilayer structure. The second common layer 203 may include an electron transport layer and/or an electron injection layer. The second common layer 203 may further include other functional layers on the electron transport layer and/or the electron injection layer. The second common layer 203 may be disposed in the first pixel area PA1, the first surrounding area SA1, the second pixel area PA2, and the second surrounding area SA2, and may not be disposed in the transmission area TA.

The second electrode 220 may be disposed on the intermediate layer 200. The second electrode 220 may be opposite the first electrode 180 with the intermediate layer 200 disposed between the electrodes 180 and 220. The second electrode 220 may be disposed in the first pixel area PA1, the first surrounding area SA1, the second pixel area PA2, and the second surrounding area SA2, and may not be disposed in the transmission area TA.

The second electrode 220 may include at least one of magnesium (Mg), silver (Ag), aluminum (Al), lithium (Li), calcium (Ca), indium (In), and ytterbium (Yb). The first electrode 180, the intermediate layer 200, and the second electrode 220 may form a light emitting element EL. A light emitting element EL may be disposed in each of the first pixel area PA1 and the second pixel area PA2.

The surface control layer 210 may be disposed on the intermediate layer 200 and between the second electrode 220 and the transmission area TA. The surface control layer 210 may be disposed in the first surrounding area SA1 and the second surrounding area SA2, and may not be disposed in the first pixel area PA1, the transmission area TA, and the second pixel area PA2. Because the surface control layer 210 is disposed between the second electrode 220 and the transmission area TA, the second electrode 220 may be spaced apart from the transmission area TA.

The second electrode 220 may not overlap the surface control layer 210 in a thickness direction of the substrate 110. A side surface 220S of the second electrode 220 may contact a side surface 210S of the surface control layer 210. Because the second electrode 220 does not overlap the surface control layer 210, the side surface 220S of the second electrode 220 may be spaced apart from the transmission area TA.

The surface control layer 210 may extend parallel to the substrate 110 in a cross-sectional view of the display device 100.

The surface control layer 210 may surround the transmission area TA in a plan view of the display device 100. The second electrode 220 may surround the surface control layer 210 in the plan view of the display device 100. When the transmission area TA has an octagonal shape in the plan view, the surface control layer 210 may have an octagonal ring shape that surrounds the transmission area TA in the plan view.

The surface control layer 210 may include one or more fluorine (F) compounds. The fluorine compounds may include at least one of difluoromethylene group, trifluoromethyl group, and fluorosilane.

A surface tension of the surface control layer 210 may be greater than 0 mJ/m$^2$ and less than or equal to about 30 mJ/m$^2$ at a room temperature. Because the surface control layer 210 has the surface tension in the aforementioned range, an adhesion between the second electrode 220 and the surface control layer 210 may be less than an adhesion between the second electrode 220 and the intermediate layer 200.

The second electrode 220 may be formed by a metal self-patterning method. Specifically, when the second electrode 220 is formed on the intermediate layer 200 after the surface control layer 210 has been formed on the intermediate layer 200, the second electrode 220 may be formed only on a portion of the intermediate layer 200 not covered by the surface control layer 210, given the relatively low adhesion between the second electrode 220 and the surface control layer 210. Advantageously, the patterned second electrode 220 may be formed without an additional patterning process.

The capping layer 230 may be disposed on the surface control layer 210 and the second electrode 220. The capping layer 230 may protect the light emitting element EL, and may help light emitted from the light emitting element EL to be efficiently emitted. The capping layer 230 may include at least one of an organic material a-NPD, NPB, TPD, m-MTDARA, Alq$_3$, CuPc, etc. and/or at least one of an inorganic material LiF, MgF$_2$, CaF$_2$, etc. The capping layer 230 may be disposed in the first pixel area PA1, the first surrounding area SA1, the second pixel area PA2, and the second surrounding area SA2, and may not be disposed in the transmission area TA.

The display device 100 may include a transmission window TW overlapping the transmission area TA. The transmission window TW may be defined by openings of elements of the display device 100, which coincide with the transmission area TA. At least one of gate insulation layer 130, the insulation interlayer 150, the planarization layer 170, the pixel defining layer 190, the intermediate layer 200, the surface control layer 210, and the capping layer 230 may have an opening that coincides with the transmission area TA.

The at least one common layer, the surface control layer 210, the capping layer 230 may respectively include a first opening OP1, a second opening OP2, and a third opening OP3 that overlap the transmission area TA. The first opening OP1 of the at least one common layer, the second opening OP2 of the surface control layer 210, and the third opening OP3 of the capping layer 230 may form the transmission window TW.

When layers are stacked in the transmission area TA, a reflectance of external light reflected at interfaces between adjacent layers may increase. The display device 100 according to the embodiments may include the transmission window TW at the transmission area TA, so that the number of the interfaces between the adjacent layers in the transmission area TA may decrease. Advantageously, a reflectance of external light reflected at the interfaces between the adjacent layers may decrease.

The encapsulation layer 240 may be disposed on the capping layer 230. The encapsulation layer 240 may include at least one inorganic encapsulation layer and at least one organic encapsulation layer.

A portion of the encapsulation layer 240 which overlaps the first pixel area PA1, the first surrounding area SA1, the second pixel area PA2, and the second surrounding area SA2 may be disposed on the light emitting element EL, may block impurities from outside from being flowed into the light emitting element EL, and may protect the light emitting element EL from external shock. A portion of the encapsulation layer 240 which overlaps the transmission area TA may fill the transmission window TW. The encapsulation layer 240 may have a planarized upper surface throughout the first pixel area PA1, the transmission area TA, the first surrounding area SA1, the second pixel area PA2, and the second surrounding area SA2.

The encapsulation layer 240 may include a first inorganic encapsulation layer 241 covering the capping layer 230 and formed along the transmission window TW, an organic encapsulation layer 242 disposed on the first inorganic encapsulation layer 241, and a second inorganic encapsulation layer 243 disposed on the organic encapsulation layer 242. The first inorganic encapsulation layer 241 and the second inorganic encapsulation layer 243 may reduce or substantially block impurities such as oxygen, moisture, etc. from flowing into the light emitting element EL. The organic encapsulation layer 242 may improve sealing characteristics of the encapsulation layer 240, may relieve internal stresses of the first inorganic encapsulation layer 241 and the second inorganic encapsulation layer 243, may compensate deficiencies of the first inorganic encapsulation layer 241 and the second inorganic encapsulation layer 243, and may provide a planarized upper surface to the second inorganic encapsulation layer 243.

Figure 6:
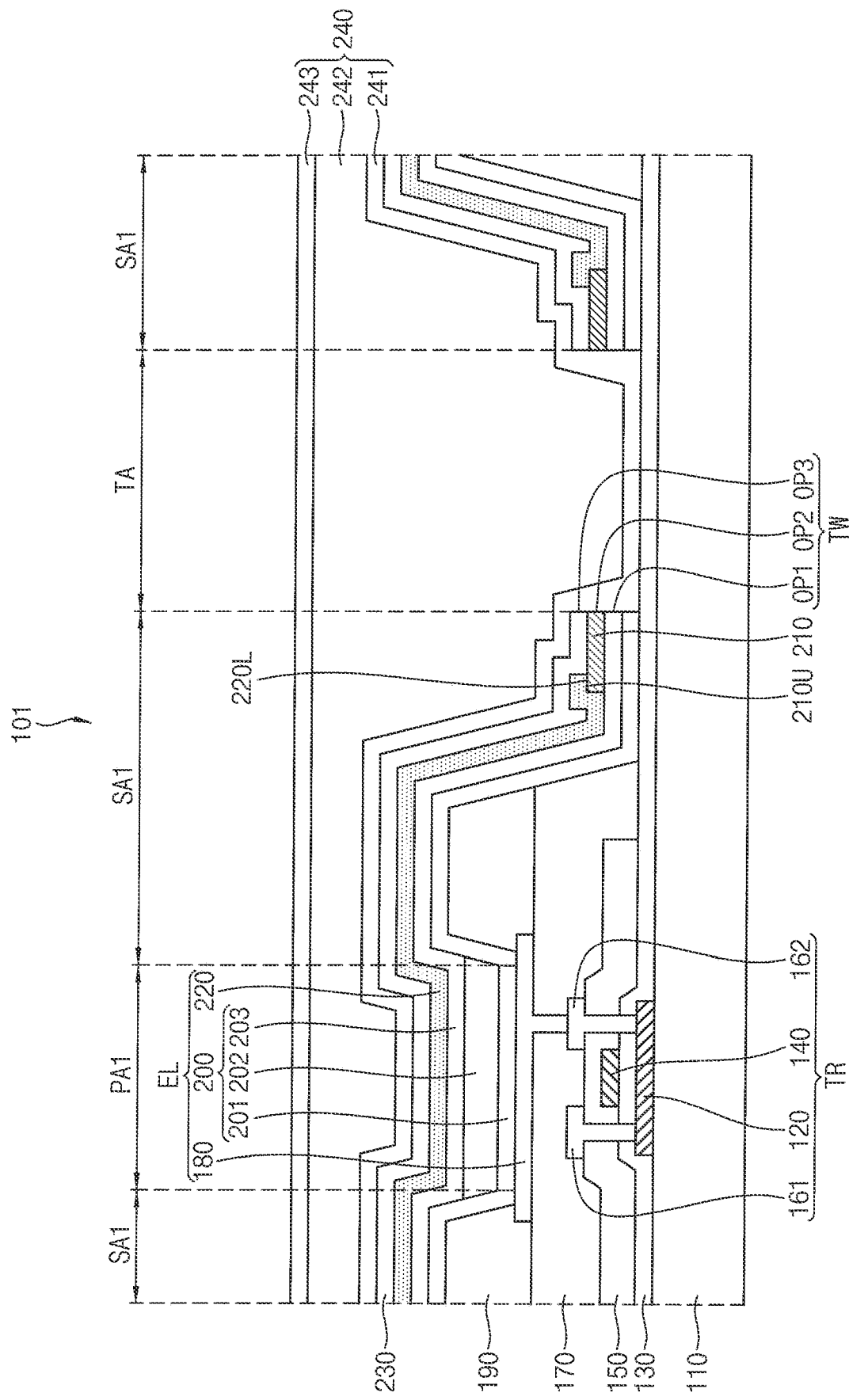
FIG. 6 is a cross-sectional view illustrating a display device according to an embodiment.

FIG. 6 is a cross-sectional view illustrating a display device 101 according to an embodiment. Elements of the display device 101 described with reference to FIG. 6 may be substantially the same as or similar to elements of the display device 100 described with reference to FIG. 4 except for a structure of the second electrode.

Referring to FIG. 6, The second electrode 220 may overlap an edge of the surface control layer 210 and may not overlap a central portion of the surface control layer 210. A lower surface 220L of a side portion of the second electrode 220 may contact an upper surface 210U of a side portion of the surface control layer 210. Because the second electrode 220 overlaps only the edge of the surface control layer 210, a side surface of the second electrode 220 may be spaced apart from the transmission area TA.

Figure 7:
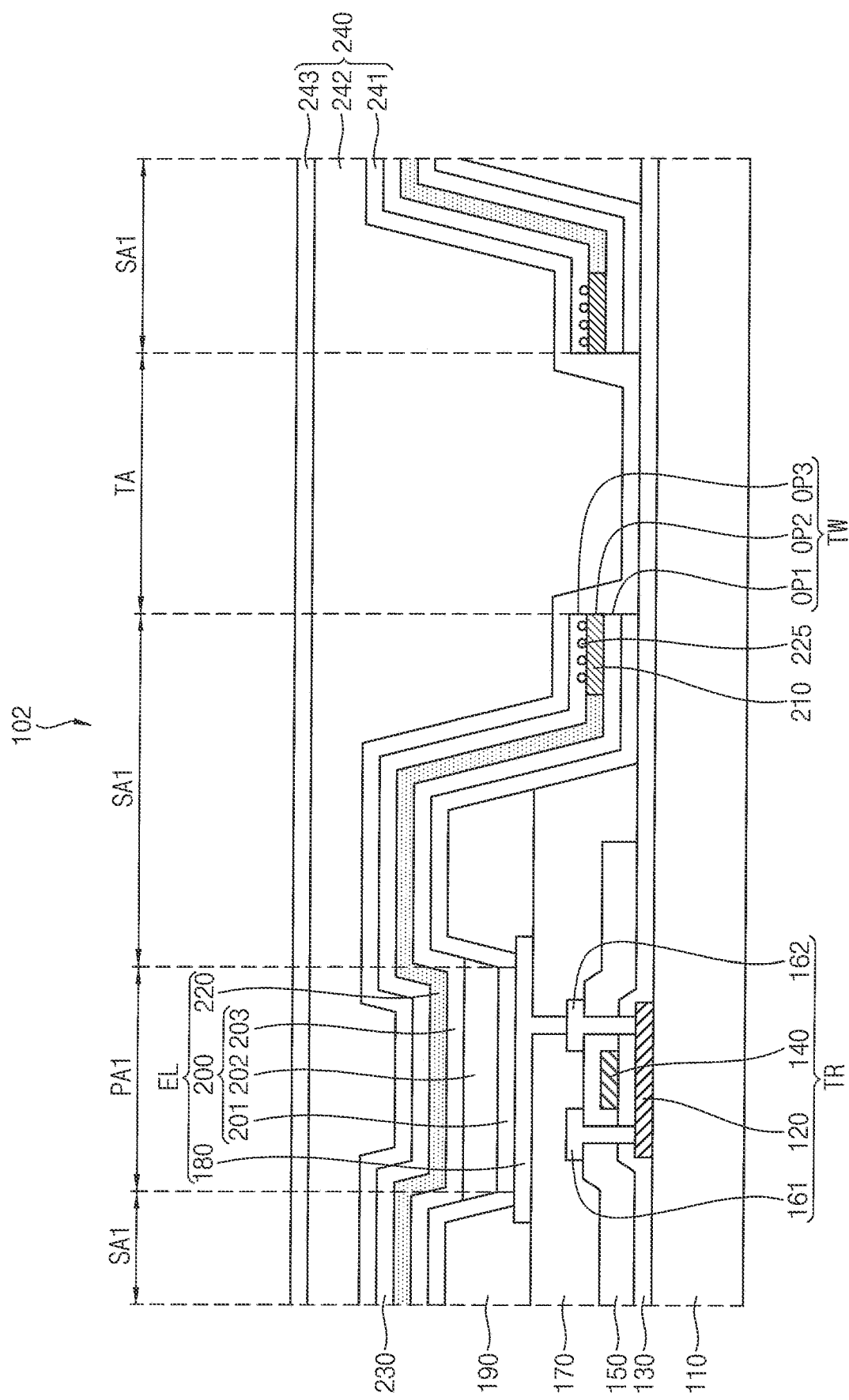
FIG. 7 is a cross-sectional view illustrating a display device according to an embodiment.

FIG. 7 is a cross-sectional view illustrating a display device 102 according to an embodiment. Elements of the display device 102 described with reference to FIG. 7 may be substantially the same as or similar to elements of the display device 100 described with reference to FIG. 4 except for agglomerated particles.

Referring to FIG. 7, the display device 102 may include agglomerated particles 225 disposed between the surface control layer 210 and the capping layer 230. The agglomerated particles 225 may include substantially the same material as that of the second electrode 220. For example, the agglomerated particles 225 may include at least one of magnesium (Mg), silver (Ag), aluminum (Al), lithium (Li), calcium (Ca), indium (In), and ytterbium (Yb). When the second electrode 220 is formed by a metal self-patterning method, materials forming the second electrode 220 may agglomerate, and may remain as the agglomerated particles 225 on the surface control layer 210.

Figure 8:
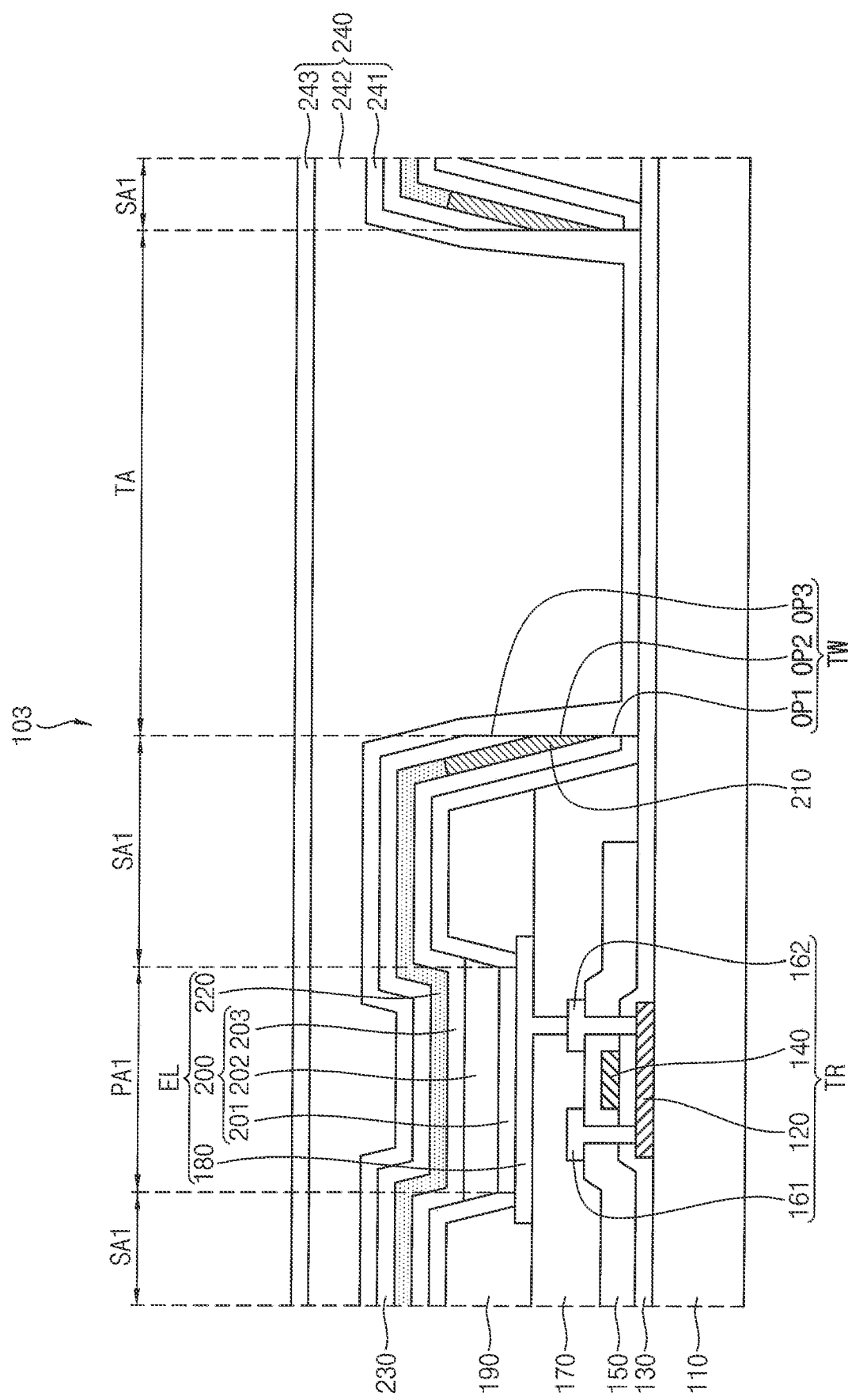
FIG. 8 is a cross-sectional view illustrating a display device according to an embodiment.

FIG. 8 is a cross-sectional view illustrating a display device 103 according to an embodiment. Elements of the display device 103 described with reference to FIG. 8 may be substantially the same as or similar to elements of the display device 100 described with reference to FIG. 4 except for structures of the surface control layer, the second electrode 220, etc.

Referring to FIG. 8, the surface control layer 210 may be inclined/oblique relative to the substrate 110 in a cross-sectional view. The surface control layer 210 may extend in a direction different from (and oblique relative to) an extending direction of the substrate 110 in the cross-sectional view. The surface control layer 210 may be disposed on an inclined sidewall of the intermediate layer 200, and an extending direction of the surface control layer 210 in the cross-sectional view may form an acute angle with the extending direction of the substrate 110.

FIGS. 9, 10, 11, 12, 13, 14, and 15 are diagrams illustrating structures formed in a method of manufacturing a display device according to one or more embodiments.

Figure 9:
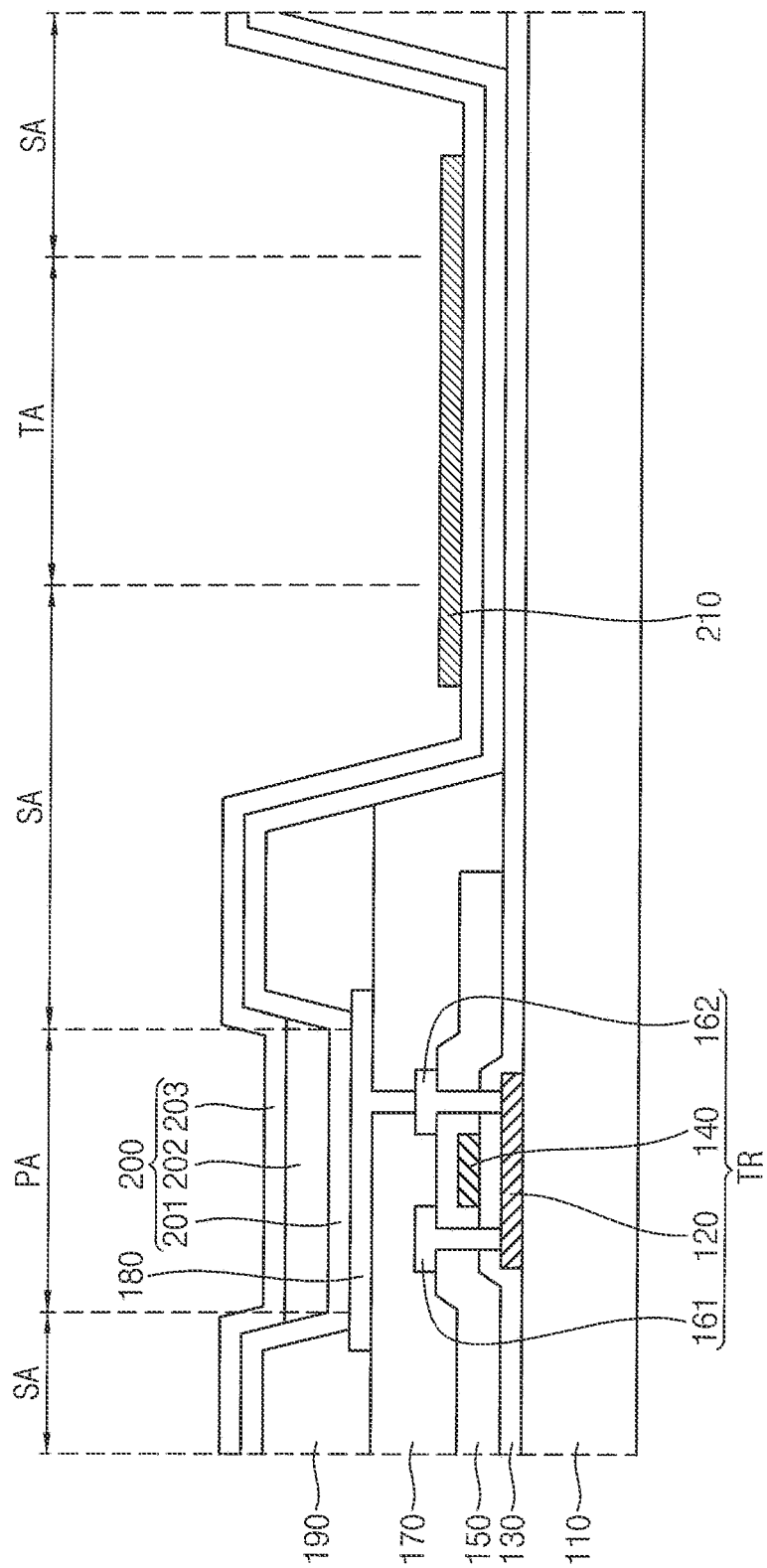
FIG. 9, FIG. 10, FIG. 11, FIG. 12, FIG. 13, FIG. 14, and FIG. 15 are diagrams illustrating structures formed in a method of manufacturing a display device according to one or more embodiments.
Figure 10:
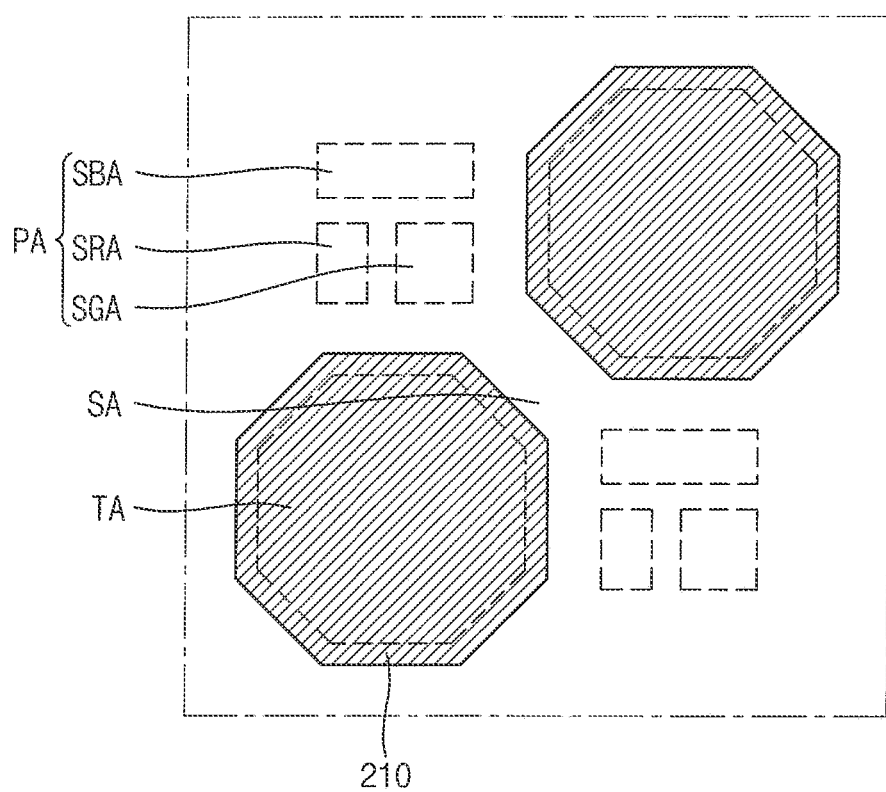

Referring to FIGS. 9 and 10, a surface control layer 210 may be formed on a substrate 110, on which a first electrode 180 and an intermediate layer 200 are formed.

An active layer 120, a gate insulation layer 130, a gate electrode 140, an insulation interlayer 150, source and drain electrodes 161 and 162, a planarization layer 170, the first electrode 180, and a pixel defining layer 190 may be sequentially formed on the substrate 110. The gate insulation layer 130 may be formed in a pixel area PA, a transmission area TA, and a surrounding area SA. The active layer 120, the gate electrode 140, the insulation interlayer 150, the source and drain electrodes 161 and 162, the planarization layer 170, and the first electrode 180 may be formed in the pixel area PA and the surrounding area SA. The pixel defining layer 190 may be formed in the surrounding area SA.

Subsequently, the intermediate layer 200 may be formed on the first electrode 180 and the pixel defining layer 190. A first common layer 201, an emission layer 202, and a second common layer 203 may be sequentially formed to form the intermediate layer 200. The first common layer 201 and the second common layer 203 may be formed in the pixel area PA, the transmission area TA, and the surrounding area SA. The emission layer 202 may be formed in the pixel area PA.

Subsequently, the surface control layer 210 may be formed on the intermediate layer 210 in the transmission area TA. The surface control layer 210 may be formed in a portion of the surrounding area SA adjacent to the transmission area TA. Accordingly, an area of the surface control layer 210 may be greater than an area of the transmission area TA in a plan view. The transmission area TA may be positioned inside the surface control layer 210 in the plan view.

The surface control layer 210 may be formed by vapor deposition such as chemical vapor deposition (CVD) or a physical vapor deposition (PVD), wet coating, or screen printing.

The surface control layer 210 may be formed on a planarized surface of the intermediate layer 200 disposed on the gate insulation layer 130. The surface control layer 210 may be also formed on an inclined surface of the intermediate layer 200 disposed on the planarization layer 170 and the pixel defining layer 190.

Figure 11:
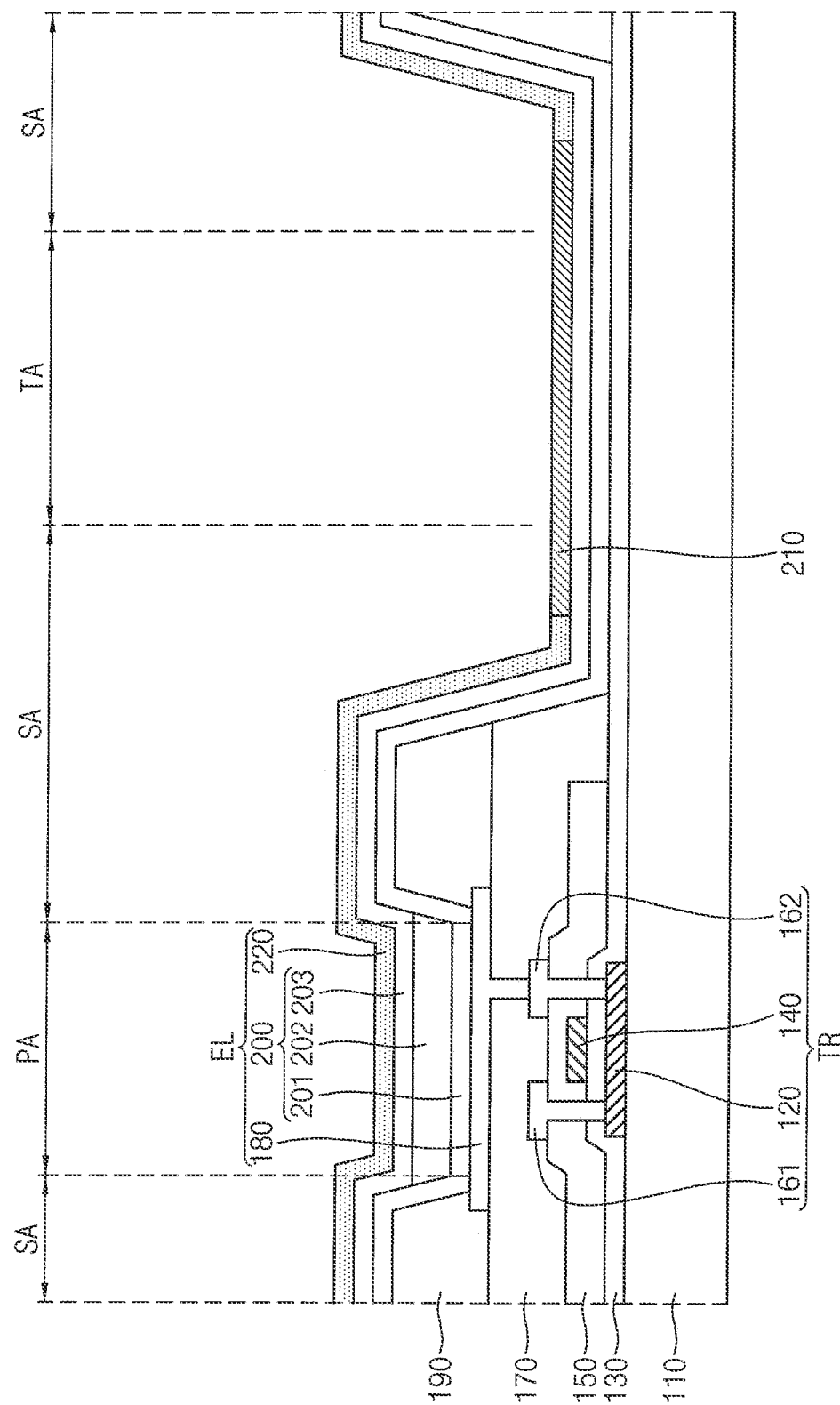
Figure 12:
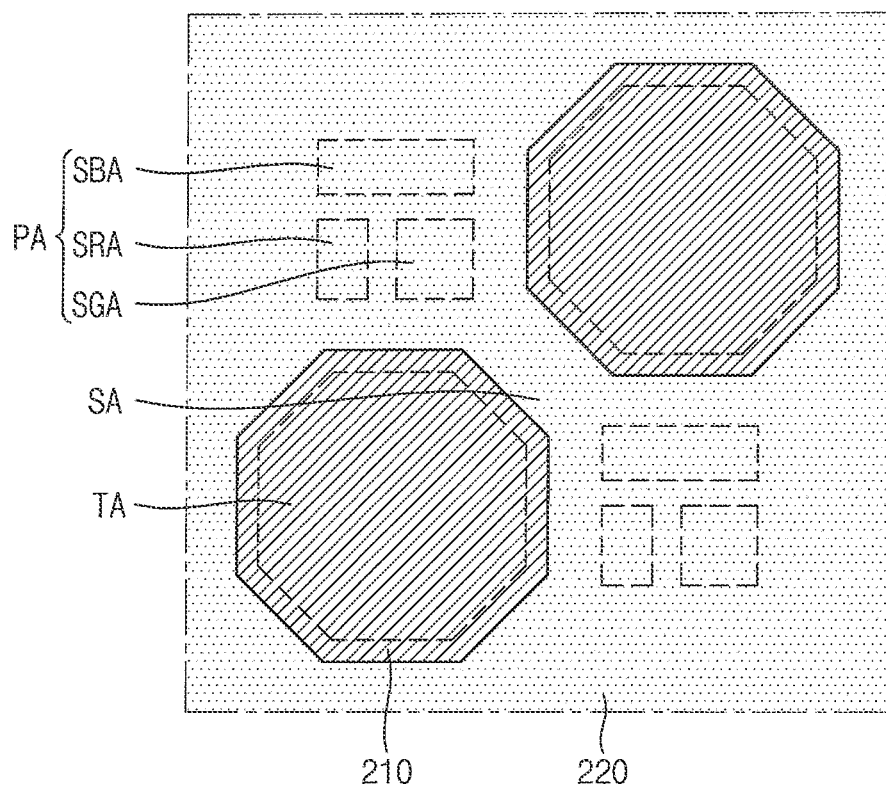

Referring to FIGS. 11 and 12, a second electrode 220 adjacent to the surface control layer 210 may be formed on the intermediate layer 200.

The second electrode 220 may be formed on a portion of the intermediate layer 200 not covered by the surface control layer 210. The second electrode 220 may be formed in the pixel area PA and a portion of the surrounding area SA adjacent to the pixel area PA. The second electrode 220 may be formed by a metal-self patterning method. Specifically, the second electrode 220 may be formed only on a portion of the intermediate layer 200 not covered by the surface control layer 210, given the relatively low adhesion between the second electrode 220 and the surface control layer 210. The patterned second electrode 220 may be formed without an additional patterning process.

The second electrode 220 may not overlap the surface control layer 210 in a thickness direction of the substrate 110. The second electrode 220 may overlap an edge of the surface control layer 210. In the process of forming the second electrode 220 by the metal self-patterning, materials forming the second electrode 220 may agglomerate, and may remain as agglomerated particles on the surface control layer 210.

Figure 13:
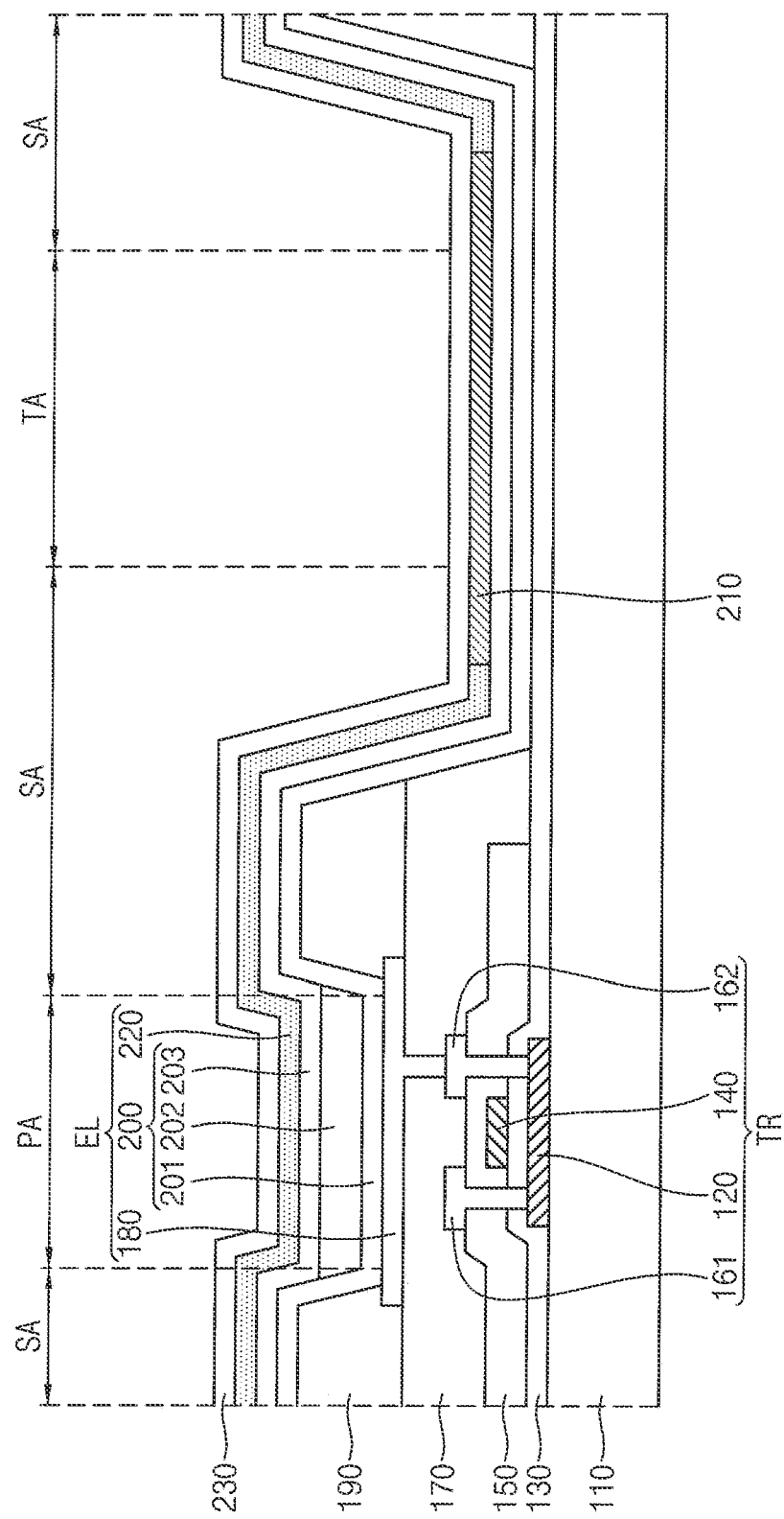

Referring to FIG. 13, a capping layer 230 may be formed on the surface control layer 210 and the second electrode 220. The capping layer 230 may be formed in the pixel area PA, the transmission area TA, and the surrounding area SA.

Figure 14:
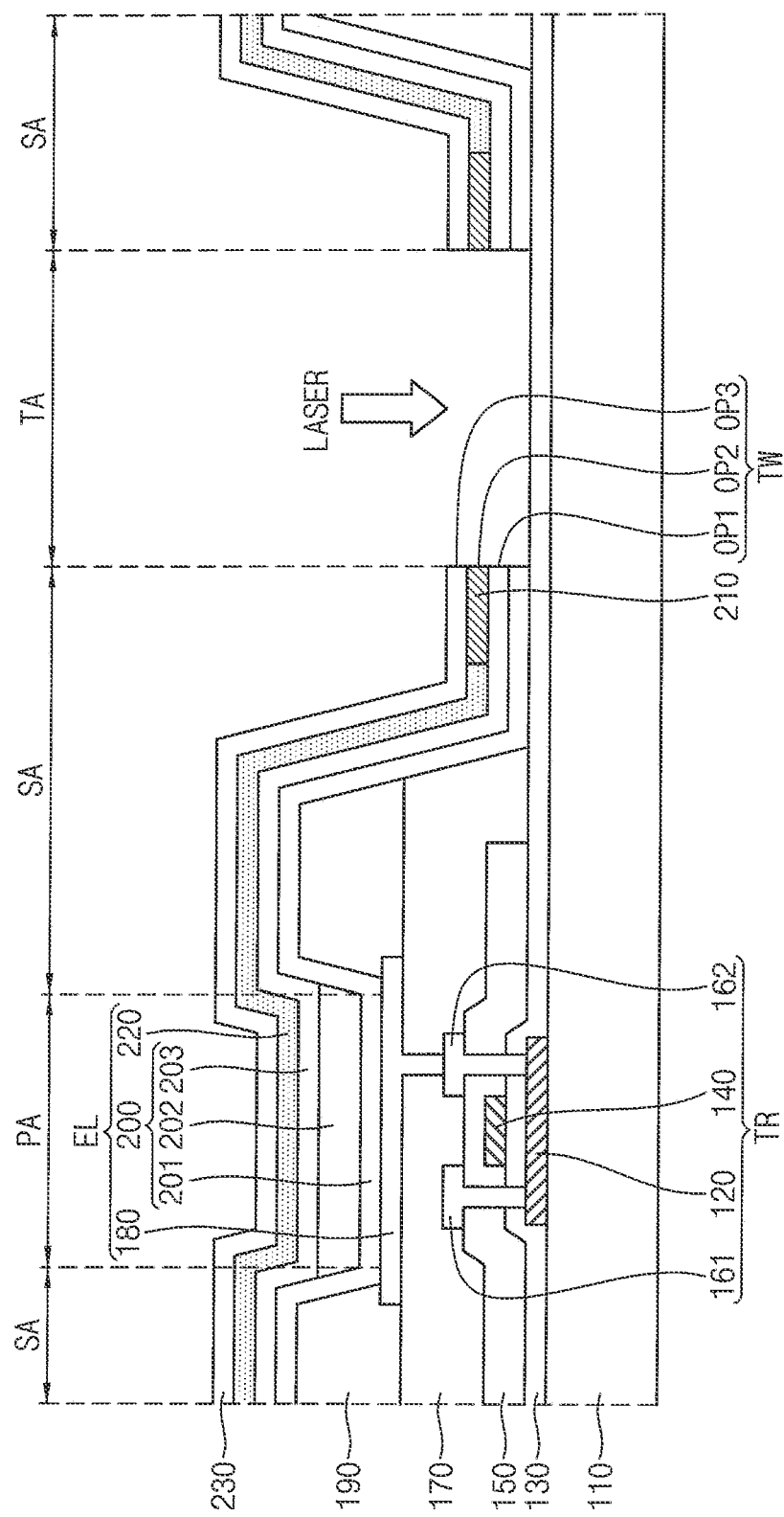

Referring to FIG. 14, portions of the intermediate layer 200, the surface control layer 210, and the capping layer 230 which overlap the transmission area TA may be removed to form a transmission window TW.

The portions of the intermediate layer 200, the surface control layer 210, and the capping layer 230 which overlap the transmission area TA may be removed by irradiation of a laser. A first opening OP1, a second opening OP2, and a third opening OP3 may be respectively formed in the portions of the intermediate layer 200, the surface control layer 210, and the capping layer 230 which coincide with the transmission area TA, and the transmission window TW may be defined by the first opening OP1, the second opening OP2, and the third opening OP3.

The laser may be irradiated to an inner side of the surface control layer 210. Accordingly, the transmission window TW may be formed inside the surface control layer 210 in the plan view. The laser may not be irradiated to the second electrode 220.

The laser may be irradiated from above the capping layer 230 to form the transmission window TW. The laser may be irradiated from below the substrate 110 to form the transmission window TW.

Figure 15:
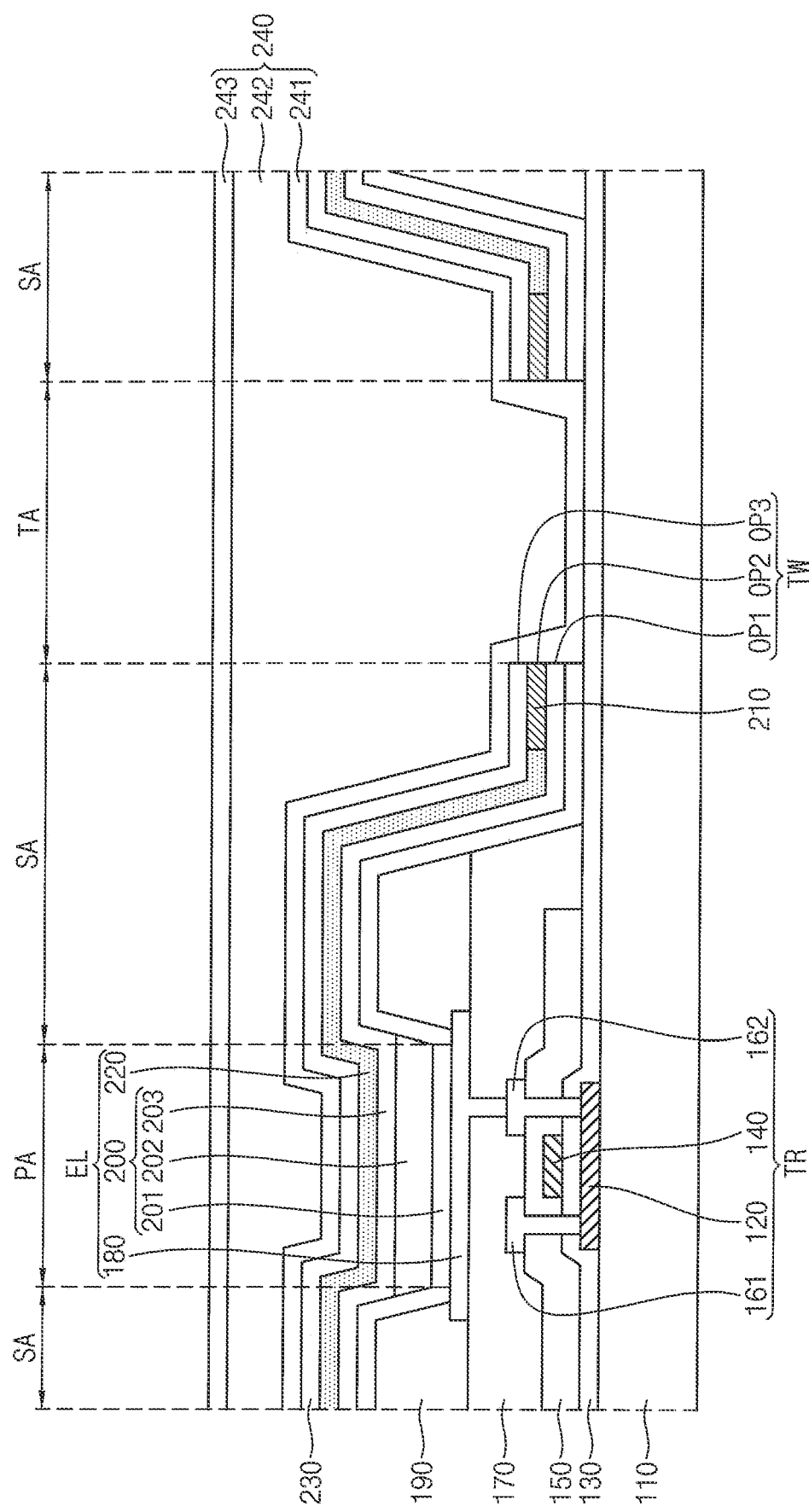

Referring to FIG. 15, an encapsulation layer 240 may be formed on the capping layer 230. A first inorganic encapsulation layer 241, an organic encapsulation layer 242, and a second inorganic encapsulation layer 243 may be sequentially formed in each of the display area PA, the transmission area TA, and the surrounding area SA to form the encapsulation layer 240.

If the surface control layer 210 is not formed in the transmission area TA, and if a laser is irradiated to partially remove the second electrode 220 formed in the pixel area PA, the transmission area TA, and the surrounding area SA, a burr may be generated on an end/edge portion of the second electrode 220 by the laser, and scattered particles may be generated in the process of partially removing the second electrode 220. As a result, the first inorganic encapsulation layer 241 of the encapsulation layer 240 may be damaged by the burr of the second electrode 220 in the process of forming the encapsulation layer 240 on the capping layer 230, and the scattered particles may cause contamination. In embodiments, the surface control layer 210 may be formed in the transmission area TA, and the laser may be irradiated within a perimeter of the surface control layer 210 in a plan view (wherein the perimeter of the surface control layer 210 is represented by two opposite edges of the surface control layer 210 shown in FIG. 14), so that no burr may be generated on the end/edge portion of the second electrode 220, and/or no significant scattered particles may be generated from the second electrode 220. Advantageously, the first inorganic encapsulation layer 241 of the encapsulation layer 240 may not be damaged.

A display device according to one or more embodiments may be included in a computer, a notebook, a mobile phone, a smartphone, a smart pad, a PMP, a PDA, an MP3 player, or the like.

Although example embodiments have been described with reference to the drawings, the example embodiments may be modified and changed without departing from the scope defined in the following claims.

What is claimed is:

1. A method for manufacturing a display device, the method comprising:
    forming a first electrode;
    forming an emission layer that overlaps the first electrode and includes a light emitting material;
    forming an intervening material layer that is spaced from each of the first electrode and the emission layer and includes a fluorine compound;
    forming a second electrode that directly contacts the intervening material layer;
    partially removing the intervening material layer to form an intervening layer that includes an exposed side; and
    forming a first encapsulation layer that overlaps the emission layer and directly contacts the exposed side of the intervening layer.

2. The method of claim 1, wherein the intervening material layer is partially removed by a laser to expose the exposed side of the intervening layer.

3. The method of claim 2, wherein the laser is irradiated within a perimeter of the intervening material layer.

4. The method of claim 1, further comprising:
    forming a capping material layer on the intervening material layer and the second electrode before partially removing the intervening material layer,
    wherein the capping material layer is partially removed to form a capping layer when or immediately before the intervening material layer is partially removed.

5. The method of claim 1, wherein the intervening material layer is formed by vapor deposition, wet coating, or screen printing.

* * * * *